(12) United States Patent
Anderson et al.

(10) Patent No.: US 7,790,636 B2
(45) Date of Patent: Sep. 7, 2010

(54) SIMULTANEOUS IRRADIATION OF A SUBSTRATE BY MULTIPLE RADIATION SOURCES

(75) Inventors: Brent Alan Anderson, Jericho, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 948 days.

(21) Appl. No.: 11/427,410

(22) Filed: Jun. 29, 2006

(65) Prior Publication Data

US 2008/0000414 A1 Jan. 3, 2008

(51) Int. Cl.
*H01L 21/00* (2006.01)
*C30B 25/00* (2006.01)

(52) U.S. Cl. .......................... 438/795; 438/799; 117/8; 117/85; 117/86

(58) Field of Classification Search ................... 117/85, 117/86, 8; 257/1; 438/795, 799
See application file for complete search history.

(56) References Cited

U.S. PATENT DOCUMENTS

| | | | | |
|---|---|---|---|---|
| 4,281,030 A | * | 7/1981 | Silfvast | 427/566 |
| 4,649,261 A | * | 3/1987 | Sheets | 219/390 |
| 4,698,486 A | * | 10/1987 | Sheets | 219/390 |
| 5,753,416 A | * | 5/1998 | Okamoto et al. | 430/311 |
| 6,753,272 B1 | * | 6/2004 | Lee et al. | 438/795 |
| 6,881,687 B1 | * | 4/2005 | Castrucci | 438/795 |
| 7,411,188 B2 | * | 8/2008 | deCecco et al. | 250/305 |
| 7,635,656 B2 | * | 12/2009 | Anderson et al. | 438/795 |
| 2001/0036755 A1 | | 11/2001 | Tanaka | |
| 2001/0039063 A1 | | 11/2001 | Markle et al. | |
| 2004/0069751 A1 | | 4/2004 | Yamazaki et al. | |
| 2005/0067384 A1 | | 3/2005 | Talwar et al. | |
| 2005/0139786 A1 | | 6/2005 | Tanaka et al. | |
| 2005/0247684 A1 | | 11/2005 | Tanaka | |
| 2007/0010973 A1 | * | 1/2007 | deCecco et al. | 702/189 |
| 2008/0000414 A1 | * | 1/2008 | Anderson et al. | 117/85 |
| 2008/0070422 A1 | * | 3/2008 | Anderson et al. | 438/795 |

(Continued)

FOREIGN PATENT DOCUMENTS

| | | |
|---|---|---|
| JP | 2003-068644 | 3/2003 |
| JP | 2004-064066 | 2/2004 |

OTHER PUBLICATIONS

Notice of Allowance (Mail Date Aug. 6, 2009) for U.S. Appl. No. 11/427,419, filed Jun. 29, 2006; Confirmation No. 2417.

(Continued)

*Primary Examiner*—G. Nagesh Rao
(74) *Attorney, Agent, or Firm*—Schmeiser, Olsen & Watts; Anthony J. Canale

(57) ABSTRACT

A method for configuring J electromagnetic radiation sources ($J \geq 2$) to simultaneously irradiate a substrate. Each source has a different function of wavelength and angular distribution of emitted radiation. The substrate includes a base layer and I stacks ($I \geq 2$) thereon. $P_j$ denotes a same source-specific normally incident energy flux on each stack from source j. For simultaneous exposure of the I stacks to radiation from the J sources, $P_j$ is computed such that an error E being a function of $|W_1 - S_1|, |W_2 - S_2|, \ldots, |W_I - S_I|$ is about minimized with respect to $P_j (j=1, \ldots, J)$. $W_i$ and $S_i$ respectively denote an actual and target energy flux transmitted into the substrate via stack i ($i=1, \ldots, I$). The stacks are exposed to the radiation from the sources characterized by the computed $P_j (j=1, \ldots, J)$.

20 Claims, 11 Drawing Sheets

U.S. PATENT DOCUMENTS

| | | | |
|---|---|---|---|
| 2008/0251877 A1* | 10/2008 | Jain et al. | 257/499 |
| 2008/0283743 A1* | 11/2008 | deCecco et al. | 250/305 |
| 2009/0121157 A1* | 5/2009 | Moffatt et al. | 250/492.2 |
| 2010/0044592 A1* | 2/2010 | Anderson et al. | 250/492.2 |

OTHER PUBLICATIONS

Office Action (Mail Date Feb. 17, 2009) and Response to Office Action (e-filed May 11, 2009) for U.S. Appl. No. 11/427,419, filed Jun. 29, 2006; Confirmation No. 2417.

Shamir, Ron; The Efficiency of the Simplex Method: A Survey; Management Science, vol. 33, No. 3, Mar. 1987; pp. 301-334.

Simplex algorithm; Wikipedia, the free encyclopedia. [online]. 5 pages. [retrieved on May 18, 2006]. Retrieved from the Internet:< URL: http://en.wikipedia.org/wiki/Simplex_algorithm >.

Ahsan, et al.; RTA-Driven Intra-Die Variations in Stage Delay, and Parametric Sensitivities for 65nm technology; 2 pages, Aug. 2006.

* cited by examiner

SIMULTANEOUS IRRADIATION OF A SUBSTRATE BY MULTIPLE RADIATION SOURCES

RELATED APPLICATION

This application is related to U.S. patent application Ser. No. 11/427,419 entitled "SERIAL ILLUMINATION OF A SUBSTRATE BY MULTIPLE RADIATION SOURCES", filed on Jun. 29, 2006, and hereby incorporated by reference.

FIELD OF THE INVENTION

The present invention relates generally to irradiation of a substrate and more particularly to simultaneous irradiation of a substrate by multiple radiation sources.

BACKGROUND OF THE INVENTION

Rapid thermal anneal (RTA) is used in semiconductor device fabrication to heat a wafer to alter the wafer's properties, such as to activate dopants, repair damage from ion implantation, transport dopants in or out of the wafer or to other locations within the wafer, etc.

Rapid thermal anneal of a silicon wafer is often effected through direct exposure of the wafer to electromagnetic radiation. Annealing is usually performed after patterning of multiple stacks of dielectric layers on the silicon wafer. When electromagnetic radiation is incident on these stacks, constructive and destructive interference occur due to reflections at each interface in the path of the incident radiation. As a result of the constructive and destructive interference specific to each interface in each stack, the fraction of the incident electromagnetic radiation transmitted (and absorbed) into the silicon wafer is different in the vicinity of different stack-wafer interfaces. Thus the wafer regions are not heated uniformly in these circumstances. The length (L) over which thermal equilibrium is achieved can be approximated by $L \sim (t^* k/c_v)^{1/2}$, where $k$ and $c_v$ are the thermal conductivity and specific heat of silicon, respectively, and t is the time scale over which the incident radiation is held at a constant power density. State-of-the-art thermal processing employs electromagnetic radiation on time scales below 0.1 s and as a result thermal equilibrium is not achieved over length scales that are smaller than a typical Very Large-Scale Integration (VLSI) die size.

Thus there is a need to improve the spatial uniformity of thermal annealing of silicon wafers.

SUMMARY OF THE INVENTION

The present invention provides a method for configuring radiation sources to simultaneously irradiate a substrate, said method comprising:

specifying J electromagnetic sources of radiation, wherein each source of the J sources is characterized by a different function of wavelength and angular distribution of its emitted radiation, said $J \geq 2$;

specifying the substrate, said substrate comprising a base layer and I stacks on the base layer, said $I \geq 2$, wherein $P_j$ denotes a same normally incident energy flux on each stack from source j such that $P_j$ is specific to source j for j=1, 2, ..., J;

specifying a target energy flux $S_i$ targeted to be transmitted via each stack i into the substrate such that $S_i$ is specific to each stack i; and for simultaneous exposure of the I stacks to electromagnetic radiation from the J sources, calculating each $P_j$ such that an error E being a function of $|W_1-S_1|, |W_2-S_2|, \ldots, |W_I-S_I|$ is about minimized with respect to $P_j$ for j=1, 2, ..., J, wherein $W_i$ denotes an actual energy flux transmitted into the substrate via stack i for i=1, 2, ..., and I.

The present invention provides a method for simultaneously irradiating a substrate by a plurality of radiation sources, said method comprising:

providing J electromagnetic sources of radiation, each source of said J sources characterized by a different function of wavelength and angular distribution of its emitted radiation, said $J \geq 2$;

providing the substrate, said substrate comprising a base layer and I stacks on the base layer, said $I \geq 2$, wherein $P_j$ denotes a same normally incident energy flux on each stack from source j such that $P_j$ is specific to source j for j=1, 2, ..., J; and concurrently exposing the I stacks to electromagnetic radiation from the J sources in one exposure step such that at least one of a first condition and a second condition is satisfied;

wherein the first condition is that an error E being a function of $|W_1-S_1|, |W_2-S_2|, \ldots, W_I-S_I|$ is about minimized with respect to $P_j$ for j=1, 2, ..., J, wherein $S_i$ denotes a specified target energy flux targeted to be transmitted via each stack i into the substrate such that $S_i$ is specific to each stack i for i=1, 2, ..., I, wherein $W_i$ denotes an actual energy flux transmitted into the substrate via stack i for i=1, 2, ..., and I;

wherein the second condition is a specified design condition on the substrate pertaining to a device parameter of the substrate.

The present invention provides a system for simultaneously irradiating a substrate by a plurality of radiation sources, said substrate comprising a base layer and I stacks on the base layer, said system comprising:

J electromagnetic sources of radiation, each source of said J sources characterized by a different function of wavelength and angular distribution of its emitted radiation, said $J \geq 2$; and means for concurrently exposing the I stacks to electromagnetic radiation from the J sources in one exposure step such that at least one of a first condition and a second condition is satisfied, wherein $I \geq 2$, and wherein $P_j$ denotes a same normally incident energy flux on each stack from source j such that $P_j$ is specific to source j for j=1, 2, ..., J;

wherein the first condition is that an error E being a function of $|W_1-S_1|, |W_2-S_2|, \ldots, W_I-S_I|$ is about minimized with respect to $P_j$ for j=1, 2, ..., J, wherein $S_i$ denotes a specified target energy flux targeted to be transmitted via each stack i into the substrate such that $S_i$ is specific to each stack i for i=1, 2, ..., I, wherein $W_i$ denotes an actual energy flux transmitted into the substrate via stack i for i=1, 2, ..., and I;

wherein the second condition is a specified design condition on the substrate pertaining to a device parameter of the substrate.

The present invention advantageously improves the spatial uniformity of thermal annealing of silicon wafers.

DETAILED DESCRIPTION OF THE INVENTION

1. Introduction

Figure 1:
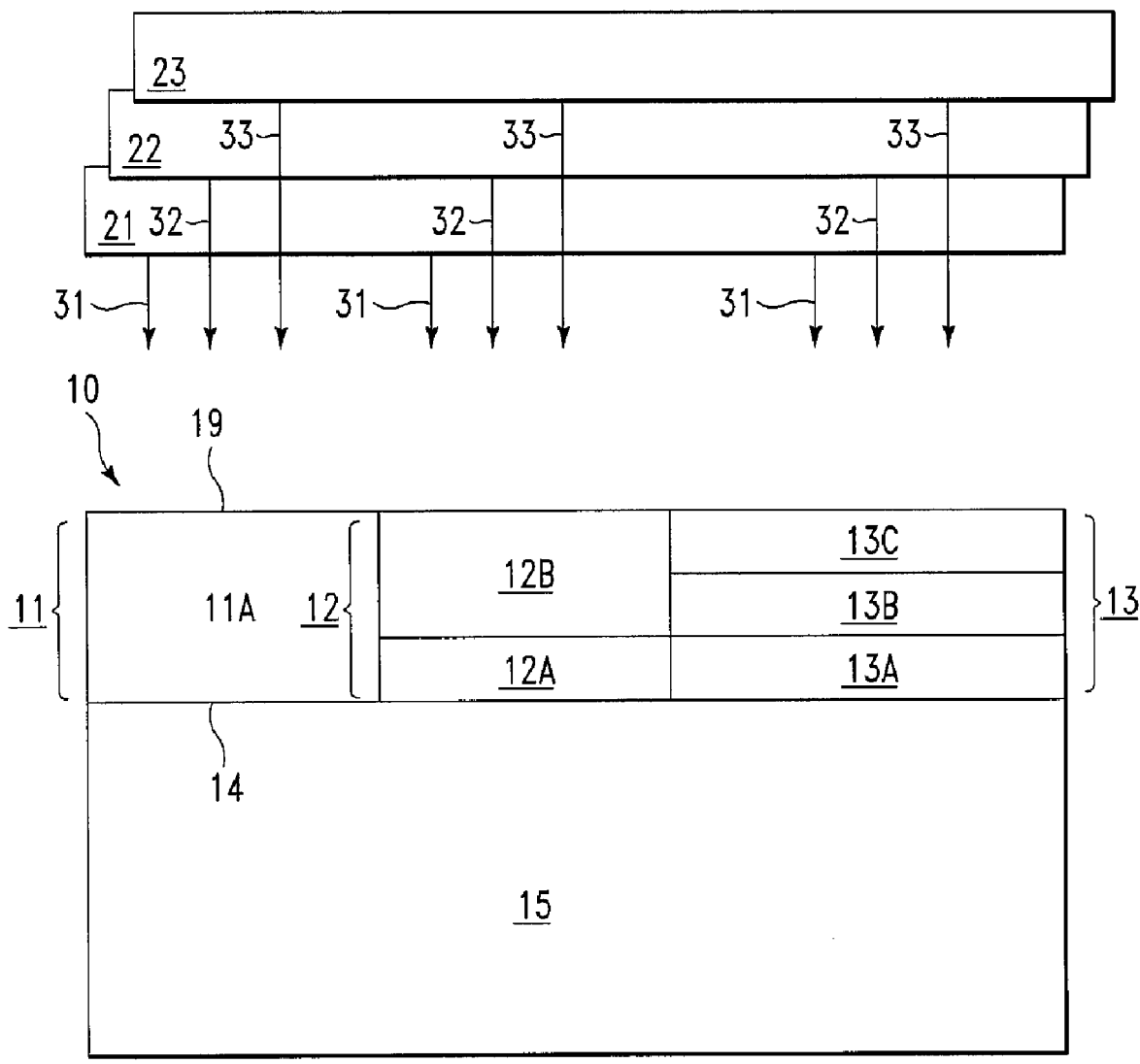
FIG. 1 depicts a front cross-sectional view of a substrate and radiation sources adapted to irradiate the substrate with electromagnetic radiation, in accordance with embodiments of the present invention.

FIG. 1 depicts a front cross-sectional view of a substrate 10 with radiation sources 21, 22, and 23 adapted to irradiate the substrate 10 with electromagnetic radiation 31, 32, and 33, respectively, in accordance with embodiments of the present invention. The radiation 31, 32, and 33 is incident on the top surface 19 of the substrate 10. The substrate 10 comprises a base layer 15 and layered stacks 11, 12, and 13 on and in direct mechanical contact with the base layer 15. The base layer 15 may comprise comprises a dielectric material, a semiconductor material, a metal, an alloy, etc. For example, the base layer 15 may be a semiconductor layer (e.g., a semiconductor wafer) comprising a semiconductor material (e.g., single crystal silicon, polysilicon, germanium, etc.—doped or undoped). The substrate 10 may terminate with the base layer 15. Alternatively the base layer 15 may be disposed between the stacks 11-13 and one or more additional layers of the substrate.

Stack 11 comprises a layer 11A of semiconductor material. Stack 12 comprises dielectric layers 12A and 12B. Stack 13 comprises dielectric layers 13A, 13B, and 13C. Each dielectric layer 12A, 12B, 13A, 13B, and 13C independently comprises a dielectric material.

Generally, a plurality of stacks is disposed on, and in direct mechanical contact with, the base layer 15. Each stack comprises one or more layers. Each layer of each stack may independently comprise a dielectric material (e.g., silicon dioxide, silicon nitride, aluminum oxide, high-k dielectric, low-k dielectric), a semiconductor material (e.g., single crystal silicon, polysilicon, germanium, etc.—doped or undoped), a metal (e.g., tungsten), an alloy (e.g., tungsten silicide), or a combination thereof. Thus, each stack has a first layer of the one or more dielectric layers that is on and in direct mechanical contact with the base layer 15. For example in FIG. 1, the first layers 11A, 12A, and 13A of dielectric stacks 11, 12, and 13, respectively, are on and in direct mechanical contact with the base layer 15 at the interfacial surface 14.

Figure 2:
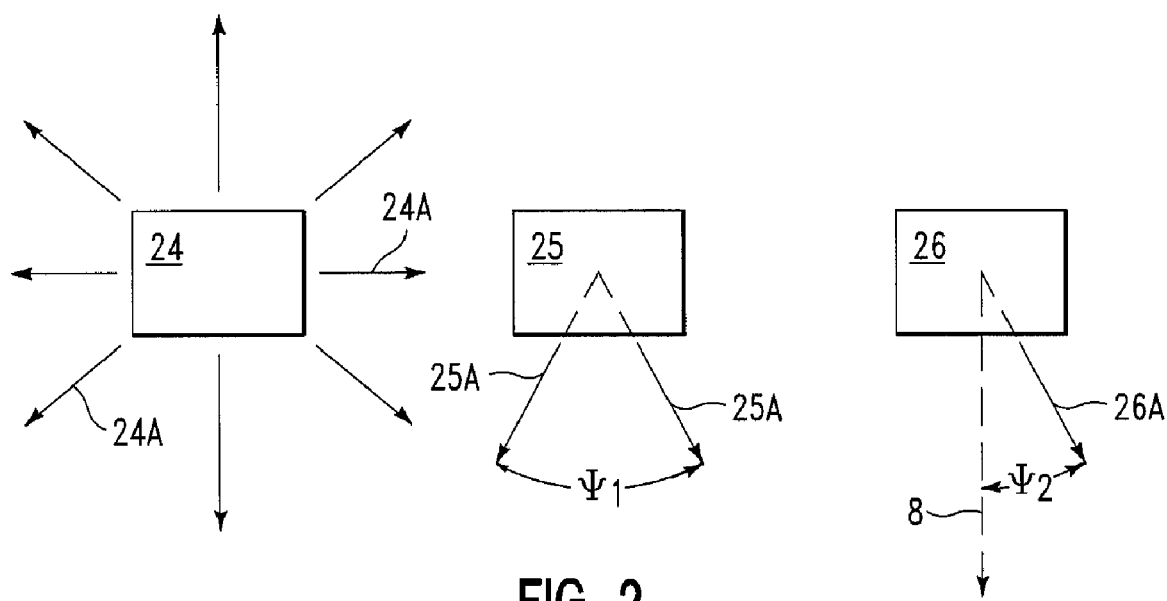
FIG. 2 depicts sources of electromagnetic radiation and their angular distributions, in accordance with embodiments of the present invention.

Each radiation source of the radiation sources 21-23 may emit radiation in any angular distribution from each source. To illustrate, FIG. 2 depicts radiation sources 24-26 of electromagnetic radiation and their angular distributions, in accordance with embodiments of the present invention. Source 24 emits radiation 24A in all directions. Source 25 emits radiation 25A within a limited solid angular range $\Psi_1$. Source 26 emits radiation 26A unidirectionally in a direction described by a solid angle $\Psi_2$ with respect to a reference direction 8.

If a source emits radiation over a finite range of directions, the emitted radiation may be isotropic or anisotropic within the finite range of directions. In addition, the sources may each be independently monochromatic or polychromatic with respect to the wavelength $\lambda$ of the radiation. Generally, the power distribution $Q(\lambda, \Psi)$ of the radiation emitted from the source, as a function of wavelength $\lambda$ and solid angular direction $\Psi$, may be of the form $Q(\lambda, \Psi)=Q_0*Q_1(\lambda, \Psi)$ subject to a normalization condition of $\iint d\Psi \, d\lambda \, Q_1(\lambda, \Psi)=1$. With the preceding normalization, $Q_0$ denotes the power generated (e.g., in units of joule/sec) by the source. If the preceding normalization is not operative, then $Q_0$ is proportional to the power generated by the source. In one embodiment, $Q_1(\lambda, \Psi)$ is separable into a product of a function $Q_{11}(\lambda)$ of $\lambda$ and a function $Q_{12}(\Psi)$ of $\Psi$ (i.e., $Q_1(\lambda, \Psi)=Q_{11}(\lambda)*Q_{12}(\Psi)$). For a monochromatic source having wavelength $\lambda_0$, $Q_{11}(\lambda)$ may be expressed in terms of a delta function; e.g., $Q_{11}(\lambda) \sim \delta(\lambda-\lambda_0)$. Each source of sources 21-23 is characterized by a power distribution $Q(\lambda, \Psi)$ whose generated power $Q_0$ is specific to each source and whose functional dependence $Q_1(\lambda, \Psi)$ on $\lambda$ and $\Psi$ is specific to each source. The sources 21-23 differ from one another with respect to $Q_1(\lambda, \Psi)$; i.e., the sources differ in the distribution of power with respect to $\lambda$, $\Psi$ or both $\lambda$ and $\Psi$.

Returning to FIG. 1, the electromagnetic radiation emitted by a given source is incident upon the substrate 10 in the direction of energy flow with an associated energy flux P. If the radiation in the direction of energy flow is projected onto a direction that is normal to the top surface 19 of the surface, then the resultant energy flux P normally directed into the stack is assumed to be stack independent (i.e., each stack receives about the same energy flux P of radiation from a given source). The energy flux into the stack is in units of power per unit surface area of the top surface 19 of the stack, which is equivalent to units of energy per unit time per unit surface area.

As explained supra, a same energy flux is incident on the different stacks from a given source and said same energy flux on each stack is specific to each source. However, different energy fluxes may be incident on the substrate 10 (and on the stacks 11-13) from different sources. Similarly, a same angular distribution of radiation is incident on the different stacks from a given source and the same angular distribution of radiation on each stack is specific to the each source. However, different angular distributions of radiation may be incident on the substrate 10 (and on the stacks 11-13) from different sources. Thus, the sources are geometrically distributed in relation to the stacks such that for each source, the there is a negligible difference in the energy flux and in the angular distribution of radiation incident on each stack.

Figure 3:
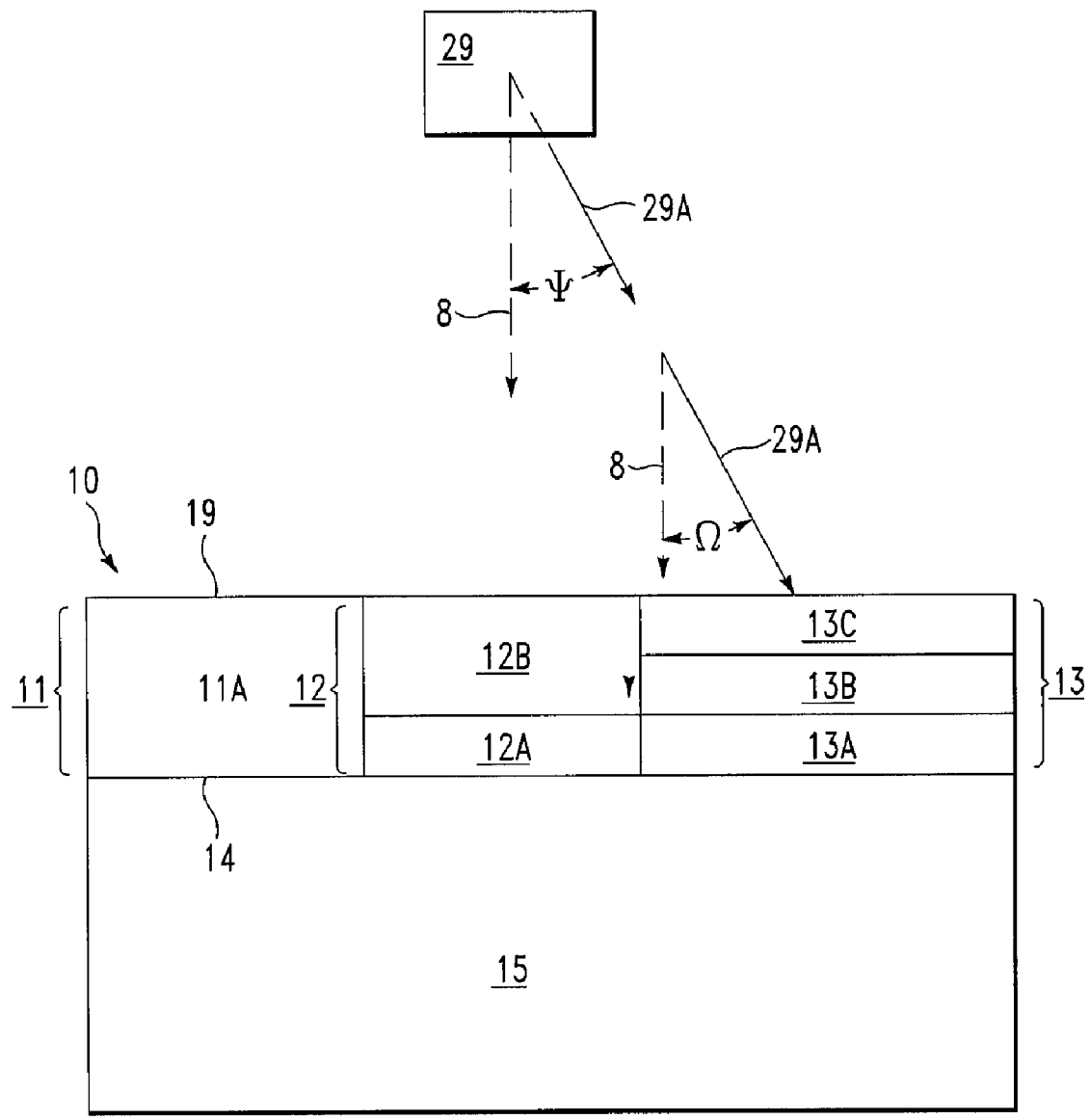
FIG. 3 depicts the substrate of FIG. 1 with radiation from a source incident on a surface of the substrate in an angular distribution characterized by a solid angle, in accordance with embodiments of the present invention.

FIG. 3 depicts the substrate 10 of FIG. 1 with radiation 29A from a source 29 incident on surface 19 of the substrate 10, in accordance with embodiments of the present invention. The source 29 may represent any of the sources 21-23 of FIG. 1. The source 29 emits the radiation 29A in an angular distribution in terms of the solid angular direction Ψ with respect to the reference direction 8, and the radiation 29A is incident on the substrate 10 in an angular distribution with respect to the solid angular direction Ω with respect to the reference direction 8. If the source 29 emits radiation according to the power distribution Q(λ, Ψ), then the energy flux component normally incident upon the substrate 10 is governed by an energy flux P (as described supra) and a distribution U(λ, Ω) in wavelength λ and solid angle Ω. Given the power distribution $Q_0 * Q_1(λ, Ψ)$ of the source as described supra, the energy flux P of radiation incident on the substrate 10, and the distribution U(λ, Ω) in wavelength λ and in solid angular direction Ω, may be deduced from $Q_0$ and $Q_1(λ, Ψ)$ by a person of ordinary skill in the art, in consideration of the location and spatial distribution of the sources 21-23 in relation to the location and normal direction of the surface 19 of the substrate 10.

Figure 4:
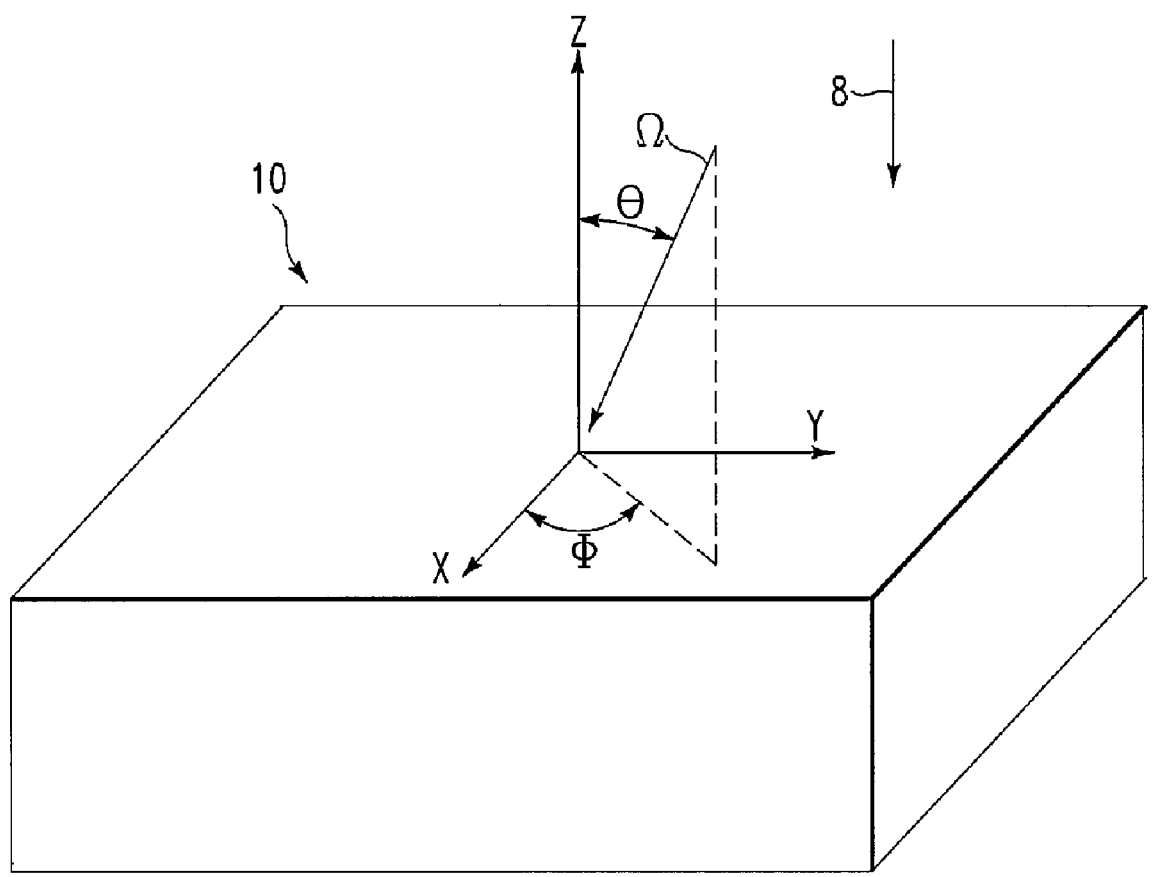
FIG. 4 illustrates that the solid angle of FIG. 3 is characterized by a polar angle and an azimuthal angle, in accordance with embodiments of the present invention.

FIG. 4 illustrates that the solid angle 9 of FIG. 3 is characterized by a polar angle θ and an azimuthal angle Φ with respect to an XYZ orthogonal coordinate system as shown, in accordance with embodiments of the present invention. The solid angle Ψ for the radiation emitted from the source 29 in FIG. 3 is similarly characterized by its polar angle and azimuthal angle (not shown).

The present invention provides a simultaneous irradiation algorithm for configuring a plurality of radiation sources to irradiate a substrate by simultaneously irradiating the substrate in one exposure step.

2. Simultaneous Irradiation Algorithm

The following simultaneous irradiation algorithm provides a method for configuring a plurality of radiation sources to simultaneously irradiate a substrate in one exposure step. The purpose of irradiating the substrate may be to, inter alia, anneal the substrate or a portion thereof. The simultaneous irradiation algorithm computes the energy flux incident on each stack of a substrate, wherein J different sources of electromagnetic radiation simultaneously irradiate I stacks in one exposure step, subject to I≧2 and J≧2. Embodiments include J<I, J=I, and J>I. Each source of the J sources is characterized by a different function $Q_1(λ, Ψ)$ of wavelength and angular distribution of its emitted radiation. As applied to FIG. 1, the simultaneous irradiation algorithm has a characteristic that all sources 21-23 simultaneously irradiate all stacks 11-13 of the substrate 10 in one exposure step.

For the simultaneous irradiation algorithm, the stacks are disposed on, and in direct mechanical contact with, the base layer within the substrate. Each stack comprises one or more layers, and each layer of each stack may independently comprise a dielectric material, a semiconductor material, a metal, an alloy, or a combination thereof. The substrate may terminate with the base layer; alternatively the base layer may be disposed between the stacks and one or more additional layers.

$P_j$ denotes the component of the energy flux that is normally incident on each stack and originates from source j (j=1, 2, ..., J).

$S_i$ denotes a target energy flux transmitted into the substrate 10 via stack i (i=1, 2, ..., I) from all sources combined. A first portion of $S_i$ may be absorbed within stack i and a second portion of $S_i$ may be transmitted through stack i to enter the base layer 15. In one embodiment, the first portion of $S_i$ is negligible in comparison with the second portion of $S_i$. $S_i$ is an input to the simultaneous irradiation algorithm. In one embodiment, a goal is to focus on how the target energy fluxes $S_i$ (i=1, 2, ..., I) are related to one another rather than on their magnitudes individually. Therefore, $S_i$ may be provided as input in a normalized form such being subject to $Σ_i S_i=1$, wherein the summation $Σ_i$ is from i=1 to i=I.

$W_i$ denotes the actual energy flux transmitted into the substrate 10 via stack i. A first portion of $W_i$ may be absorbed within stack i and a second portion of $W_i$ may be transmitted through stack i to enter the base layer 15. In one embodiment, the first portion of $W_i$ is negligible in comparison with the second portion of $W_i$.

$T_{ij}$ is a transmission coefficient for stack i relative to energy flux $P_j$. In particular, $T_{ij}$ is the fraction of energy flux $P_j$ that is transmitted via stack i into the substrate 10. $T_{ij}$ may be determined experimentally, or by calculation as described infra. Note that $W_i$ is related to $P_j$ via $T_{ij}$, i.e., $$W_i = Σ_j T_{ij} P_j \quad (1)$$

wherein the summation $Σ_j$ is from j=1 to j=J.

Given $S_i$ (e.g., via user input), the simultaneous irradiation algorithm determines the energy fluxes $P_j$, j=1, 2, ..., J) so as to closely match $W_i$ to $S_i$. In particular the simultaneous irradiation algorithm minimizes an error E which is a function of $|W_1-S_1|, |W_2-S_2|, ..., |W_I-S_I|$. For example, E may have the functional form:

$$E = Σ_i |W_i - S_i|^B \quad (2A)$$

wherein B is a positive real number, and wherein the summation $Σ_i$ is from i=1 to i=I. In one embodiment B=2, resulting in E being expressed as:

$$E = Σ_i (W_i - S_i)^2 \quad (2B)$$

For illustrative purposes, the following discussion will employ Equation (2B) for E. However, as stated supra, the scope of the present invention generally considers E to be a function of $|W_1-S_1|, |W_2-S_2|, ..., |W_I-S_I|$ such as in the embodiment of Equation (2A). Substituting $W_i$ of Equation (1) into Equation (2B):

$$E = Σ_i ((Σ_j T_{ij} P_j) - S_i)^2 \quad (3)$$

Thus given $T_{ij}$ and $S_i$ (i=1, 2, ..., I and j=1, 2, ..., J) which are inputs to the simultaneous irradiation algorithm, a minimization of E in Equation (3) determines $P_j$ for j=1, 2, ..., J. Minimizing E with respect to $P_j$ is defined as minimizing E with respect to arbitrarily small variations in $P_j$. For example, E may be minimized via solving $$∂E/P_m = 0 \text{ for } m=1, 2, ..., J$$

which is equivalent to:

$$Σ_i (T_{im} (Σ_j T_{ij} P_j) - S_i) = 0 \text{ for } m=1, 2, ...J \quad (4)$$

and which reduces to the following set of linear equations for computation of $P_j$:

$$Σ_j A_{mj} P_j = H_m; m=1, 2, ..., J \quad (5)$$

wherein $$A_{mj} = Σ_i T_{im} T_{ij} \quad (6)$$

$$H_m = Σ_i T_{im} S_i \quad (7)$$

After the energy fluxes $P_j$ are computed by solving Equations (5) for $P_j$, or by minimizing E in Equation (3) by any other technique, the computed values of $P_j$ may be substituted into Equation (3) to compute the error E. In some embodiments, $E=0$ (i.e., $W_i=S_i$ for $i=1, \ldots, I$). For example, if $I=J$ (i.e., same number of stacks and sources), then each term in the summation over i may be set equal to zero in Equation (3); i.e., $$(\Sigma_j T_{ij} P_j) - S_i = 0 \text{ for } i=1, 2, \ldots, I \quad (8)$$

which has a solution for $P_j$ ($j=1, 2, \ldots, J$) if the matrix $T_{ij}$ is invertable (i.e., if the matrix $T_{ij}$ is non-singular).

However, the error E may be non-zero and could be compared with a maximum acceptable error $E_{MAX}$ for acceptability. If $E > E_{MAX}$, then several remedies may be available. These remedies change the model of the radiation sources. The currently used sources could be changed with respect to their characteristics, and execution of the preceding simultaneous irradiation algorithm is then repeated (e.g., by change of power spectrum and/or angular distribution of radiated power for polychromatic sources; by change of wavelength and/or the direction of energy propagation for monochromatic sources). Alternatively, one or more additional sources could be added. Another source model change is to both change source characteristics of the currently used sources and add one or more additional sources.

Figure 5:
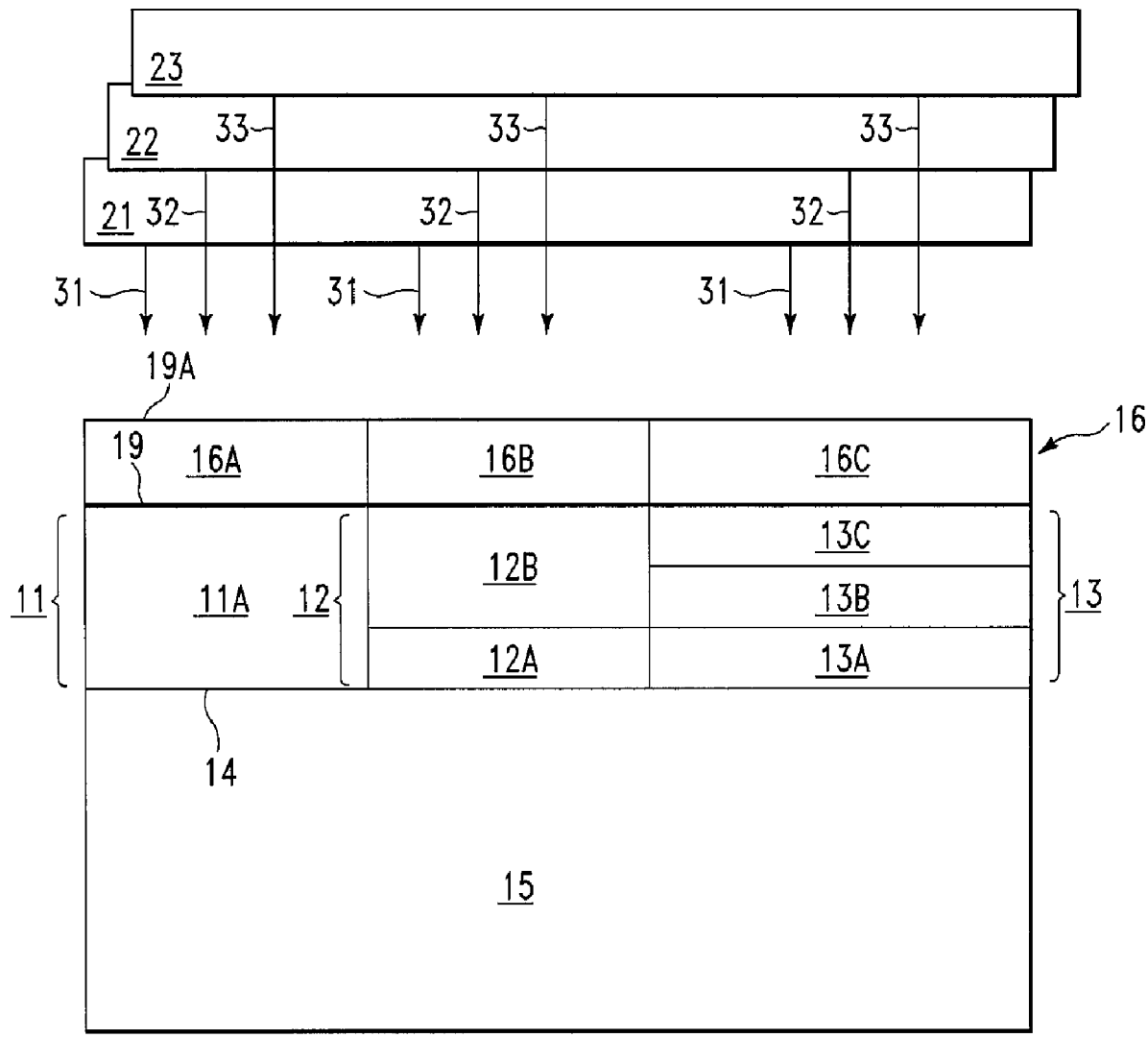
FIG. 5 depicts the substrate of FIG. 1 after a dielectric film is placed on the top surface of the substrate, in accordance with embodiments of the present invention.

As another remedy, as depicted in FIG. 5 in accordance with embodiments of the present invention, a dielectric film 16 is placed on the top surface 19 of the substrate 10 (either on the entire surface 19 as shown or on top of selected stacks i) in order to increase the transmission coefficient $T_{ij}$ of those stacks i through which the incident energy flux $P_j$ is otherwise poorly transmitted. The dielectric film 16 comprises layers 16A, 16B, and 16C, which serve as extensions of stacks 11, 12, and 13, respectively. Thus, the transmission coefficient $T_{ij}$ of each stack i is changed by the addition of the layers 16A, 16B, and 16C to the stacks 11, 12, and 13, respectively. For example, if layer 11A of stack 11 comprises semiconductor material which is characterized by poor transmission of electromagnetic radiation through the stack 11, then the addition of layer 16A to stack 11 may substantially increase the transmission coefficient of stack 11. With the addition of the dielectric film 16, surface 19A replaces surface 19 as the top surface of the substrate 10.

An attempt to solve Equation (5) for $P_j$ could have other associated problems. For example, there may be no unique solution for $P_j$ (e.g., if the matrix $A_{mj}$ of Equation (6) is singular, or if the matrix $T_{ij}$ is singular for the case of $I=J$, then there is no unique solution for $P_j$). As another example, the solution for $P_j$ may be non-physical; i.e., at least one of the energy fluxes $P_j$ is computed to be negative. Generally, any of the preceding problematic cases (i.e., unacceptable error, no solution, non-physical solution) may trigger any of the preceding remedies followed by repetition of execution of the preceding simultaneous irradiation algorithm.

After $P_j$ ($j=1, 2, \ldots, J$) is successfully calculated as described supra, the powers $Q_{0j}$ ($j=1, 2, \ldots, J$) at the j sources may be computed from $P_j$ ($j=1, 2, \ldots, J$) and given geometric relationships between the sources and the top surface 19 of the substrate 10 as described supra. The preceding simultaneous irradiation algorithm is described in the flow chart of FIG. 6.

Figure 6:
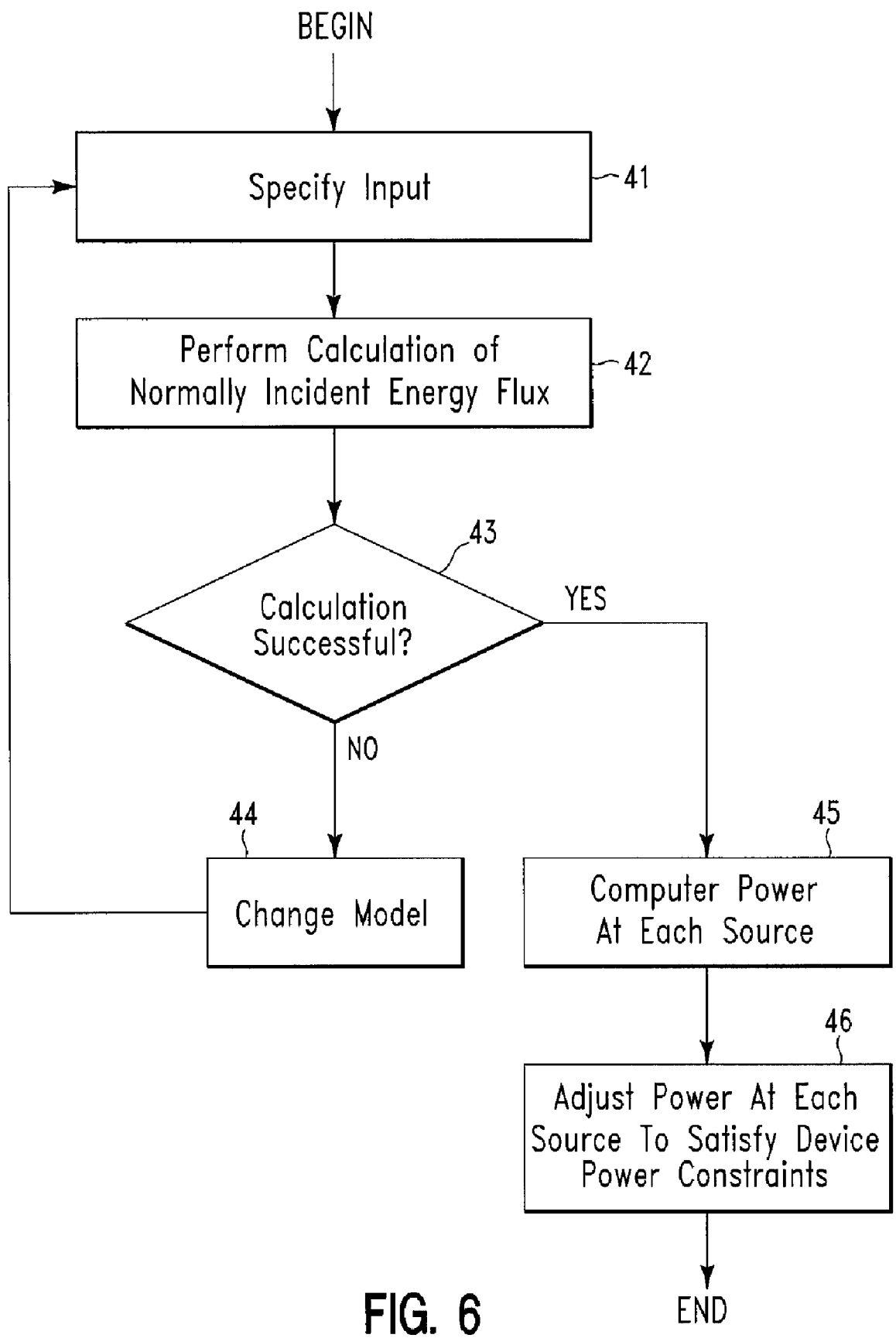
FIG. 6 is a flow chart describing a method for configuring radiation sources to simultaneously irradiate a substrate with a plurality of radiation fluxes in one exposure step, in accordance with embodiments of the present invention.

FIG. 6 is a flow chart describing a method for configuring radiation to simultaneously irradiate a substrate with a plurality of radiation fluxes in one exposure step, in accordance with embodiments of the present invention. The method of FIG. 6 computes the normal energy flux $P_j$ ($j=1, 2, \ldots, J$) incident on each stack of a substrate, wherein J sources of electromagnetic radiation simultaneously irradiate I stacks, subject to $I \geq 2$, and $J \geq 2$. Embodiments include $J<I$, $J=I$, and $J>I$.

Step 41 specifies input to the simultaneous irradiation algorithm, said input comprising: J electromagnetic sources of illumination; a substrate; target energy fluxes $S_i$ ($i=1, 2, \ldots, I$); and transmission coefficients $T_{ij}$. Each source of the J sources is characterized by a different function of wavelength and angular distribution of its emitted radiation. The input for the J electromagnetic sources includes specification of the distribution $Q_j(\lambda, \Psi)$ in wavelength $\lambda$ and solid angle $\Psi$ of the emitted radiation for each source j ($j=1, 2, \ldots, J$).

The substrate comprises a base layer and I stacks thereon. Each stack comprises at least one layer such that a first layer of the at least one layer is on and in direct mechanical contact with the base layer. Each layer of each stack may independently comprise a dielectric material, a semiconductor material, a metal, an alloy, or a combination thereof. $P_j$ denotes a same normally incident energy flux on each stack from source j such that $P_j$ is specific to source j for $j=1, 2, \ldots, J$. The target energy flux $S_i$ is targeted to be transmitted via each stack i into the substrate such that $S_i$ is specific to each stack i for $i=1, 2, \ldots, I$. The transmission coefficient $T_{ij}$ is defined as the fraction of the energy flux $P_j$ that is transmitted into the substrate via stack i.

For concurrent exposure of the I stacks to irradiation from the J sources, step 42 performs a calculation of each $P_j$ such that $\Sigma_i (W_i - S_i)^2$ (i.e., a summation over i from $i=1$ to $i=I$ of $(W_i - S_i)^2$) is about minimized with respect to arbitrarily small variations in $P_j$ for $j=1, 2, \ldots, J$, wherein $W_i$ denotes an actual energy flux transmitted into the substrate via stack i for $i=1, 2, \ldots$ and I, and wherein $W_i = \Sigma_j T_{ij} P_j$ such that $\Sigma_j$ denotes a summation over j from $j=1$ to $j=J$.

The calculation of $P_j$ in step 42 may be successful or may not be successful for the reasons stated supra (i.e., unacceptable error, no solution, non-physical solution). Step 43 determines whether the calculation of $P_j$ ($j=1, 2, \ldots, J$) in step 42 was successful.

If step 43 determines that the calculation of $P_j$ ($j=1, 2, \ldots, J$) in step 42 was not successful, then step 44 changes the model in any manner that has been described supra (i.e., changing source characteristics of one or more sources and/or adding one or more additional sources and/or placing a dielectric film on the top surface of the substrate), followed by iteratively looping back to step 41 to repeat performance of steps 41-44 until step 43 determines that the calculation of $P_j$ ($j=1, 2, \ldots, J$) in step 42 was successful or until a maximum specified number of iterations of steps 41-44 has been performed. As explained supra, changing source characteristics of one or more sources may be implemented by change of power spectrum and/or angular distribution of radiated power which may be implemented: for polychromatic sources; by changing at least one polychromatic source to a monochromatic source; by changing at least one monochromatic source to a polychromatic source; by changing wavelength and/or the direction of energy propagation for monochromatic sources; etc. Note that the only input in step 41 that would need to be provided after executing step 44 is the input that has been changed for the current iteration (e.g., input related to model changes in the preceding execution of step 44).

If step 43 determines that the calculation of $P_j$ ($j=1, 2, \ldots, J$) in step 42 was successful, then step 45 calculates the power $Q_{0j}$ ($j=1, 2, \ldots, J$) at the J sources from the calculated $P_j$ ($j=1, 2, \ldots, J$). As discussed supra, the power at the J sources may be deduced from the calculated $P_j$ and the inputted $Q_j(\lambda, \Psi)$ ($j=1, 2, \ldots, J$).

The method of FIG. 6 could end with performance of step 45. Alternatively, step 46 may be performed after step 45 is performed.

In step 46, the computed J source powers $Q_{0j}$ (j=1, 2, ..., J) are adjusted or tuned to satisfy a design condition on the substrate 10 of FIG. 1. For example, the adjusted source powers may be obtained by experimental evaluation, comprising performing anneal experiments on wafers and measuring device parameters such as transistor threshold voltage, extrinsic resistance, or drive current, or other device parameters such as doped-silicon sheet resistances. The source powers $Q_{0j}$ may be varied individually or in aggregate to reflect desired parameters measured at multiple locations having varying average stack compositions, wherein the adjusted source powers enable achievement of specified uniformity or conformance to specified variation in the preceding device parameters.

Figure 7:
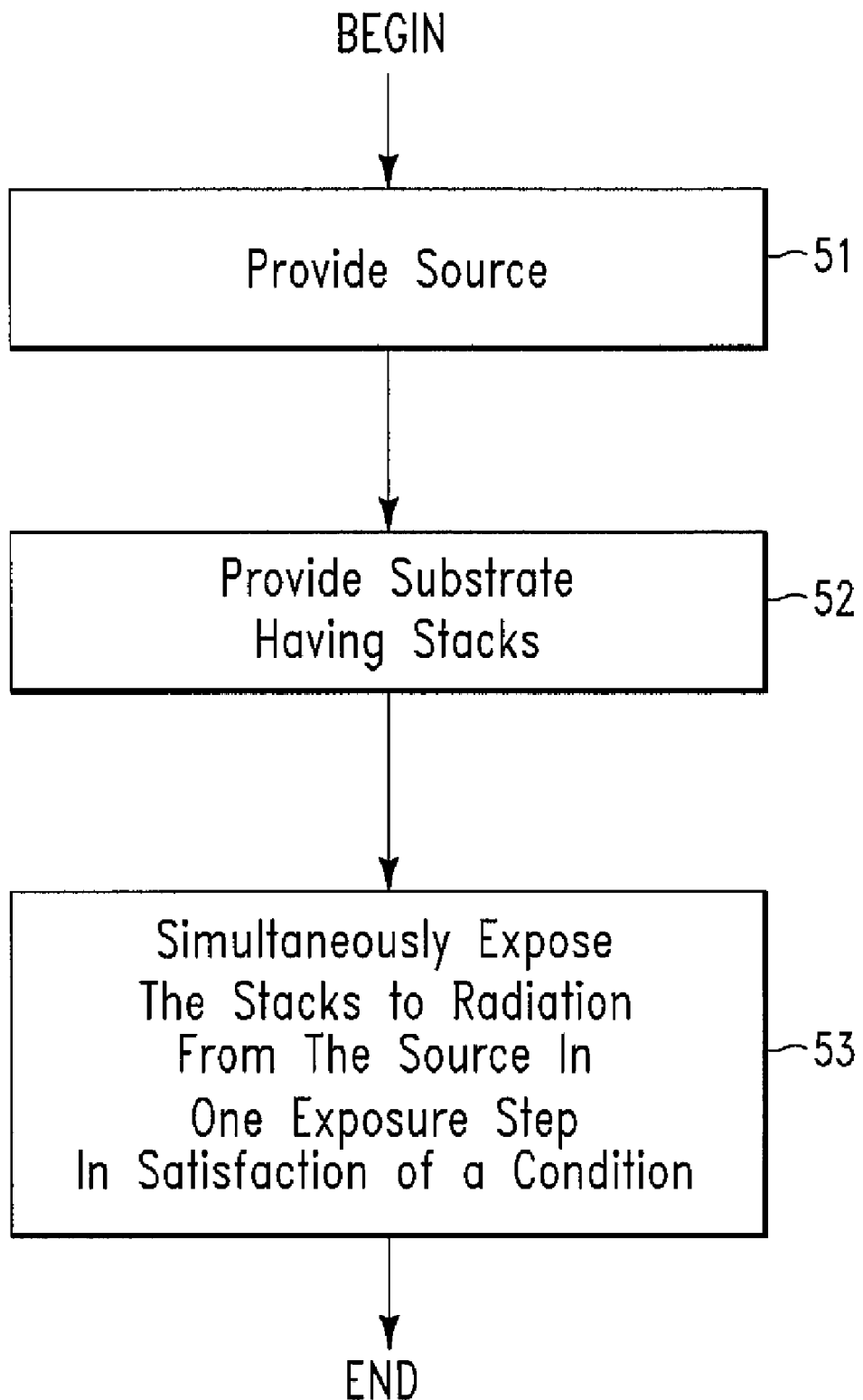
FIG. 7 is a flow chart describing a method for simultaneously irradiating a substrate with a plurality of radiation fluxes in one exposure step, in accordance with embodiments of the present invention.

FIG. 7 is a flow chart describing a method for simultaneously irradiating a substrate with a plurality of radiation fluxes in one exposure step, in accordance with embodiments of the present invention. The method of FIG. 7 utilizes the source powers computed in accordance with the preceding simultaneous irradiation algorithm of FIG. 6.

Step 51 provides J electromagnetic sources of radiation, wherein J≧2. Each source of the J sources is characterized by a different function of wavelength and angular distribution of its emitted radiation.

Step 52 provides a substrate. The substrate comprises a base layer and I stacks thereon, wherein I≧2. Embodiments include J<I, J=I, and J>I. Each stack comprises at least one layer such that a first layer of the at least one layer is on and in direct mechanical contact with the base layer. Each layer of each stack may independently comprise a dielectric material, a semiconductor material, a metal, an alloy, or a combination thereof. $P_j$ denotes a same normally incident energy flux on each stack from source j such that $P_j$ is specific to source j for j=1, 2, ..., J.

Step 53 concurrently exposes the I stacks to radiation from the J sources in one exposure step such that either a first condition or a second condition is satisfied.

The first condition is that $\Sigma_i (W_i - S_i)^2$ (i.e., a summation over i from i=1 to i=I of $(W_i - S_i)^2$) is about minimized with respect to arbitrarily small variations in $P_j$ for j=1, 2, ..., J. $S_i$ denotes a specified target energy flux targeted to be transmitted via each stack i into the substrate such that $S_i$ is specific to each stack i for i=1, 2, ..., I. $W_i$ denotes an actual energy flux transmitted into the substrate via stack i for i=1, 2, ..., and I. $W_i = \Sigma_j T_{ij} P_j$ such that the summation $\Sigma_j$ is from j=1 to j=J. $T_{ij}$ defined as the fraction of the energy flux $P_j$ that is transmitted via stack i into the substrate.

The second condition is a specified design condition on the substrate pertaining to a device parameter of the substrate such as transistor threshold voltage, extrinsic resistance, or drive current, or other device parameters such as doped-silicon sheet resistances as described supra in conjunction with step 46 of FIG. 6.

3. Determination of Transmission Coefficients

Let the energy flux incident on the substrate from a given radiation source be described as a distribution $U(\lambda, \Omega)$ in wavelength $\lambda$ and solid angle $\Omega$. Let $T(\lambda,\Omega)$ denote the transmission coefficient of a stack for a given wavelength $\lambda$ and solid angle $\Omega$. $T(\lambda,\Omega)$ may be determined experimentally by experimental techniques known to a person of ordinary skill in the art. Alternatively, $T(\lambda,\Omega)$ may be calculated for each specified combination of $\lambda$ and $\Omega$, as will be described infra.

After $T(\lambda,\Omega)$ is determined, either experimentally or by calculation, the integrated transmission coefficient T for the stack may be calculated via $$T = \iint d\Omega \, d\lambda \, U(\lambda,\Omega) T(\lambda,\Omega) / \iint d\Omega \, d\lambda \, U(\lambda,\Omega) \tag{9}$$

The integrations in Equation (9) are performed over the range of wavelength $\lambda$ and solid angle $\Omega$ for which $U(\lambda,\Omega)$ is defined. The role of $U(\lambda,\Omega)$ in Equation (9) is that of a weighting function reflecting how the incident radiation from the given source is distributed in both wavelength $\lambda$ and solid angle $\Omega$.

Alternatively, T for each stack receiving radiation from the given radiation source may be determined experimentally by experimental techniques known to a person of ordinary skill in the art.

$T(\lambda,\Omega)$ may be computed for a given combination of $\lambda$ and $\Omega$, wherein $\Omega$ e such that the radiation incident upon the substrate 10 may be normal or non-normal to the substrate 10. In Section 3.1, an algorithm for calculating $T(\lambda,\Omega)$ will be described under the assumption that the radiation is normally incident upon the substrate. In Section 3.2, an algorithm for calculating $T(\lambda,\Omega)$ will be described for any solid angle of incidence $\Omega$.

Figure 8:
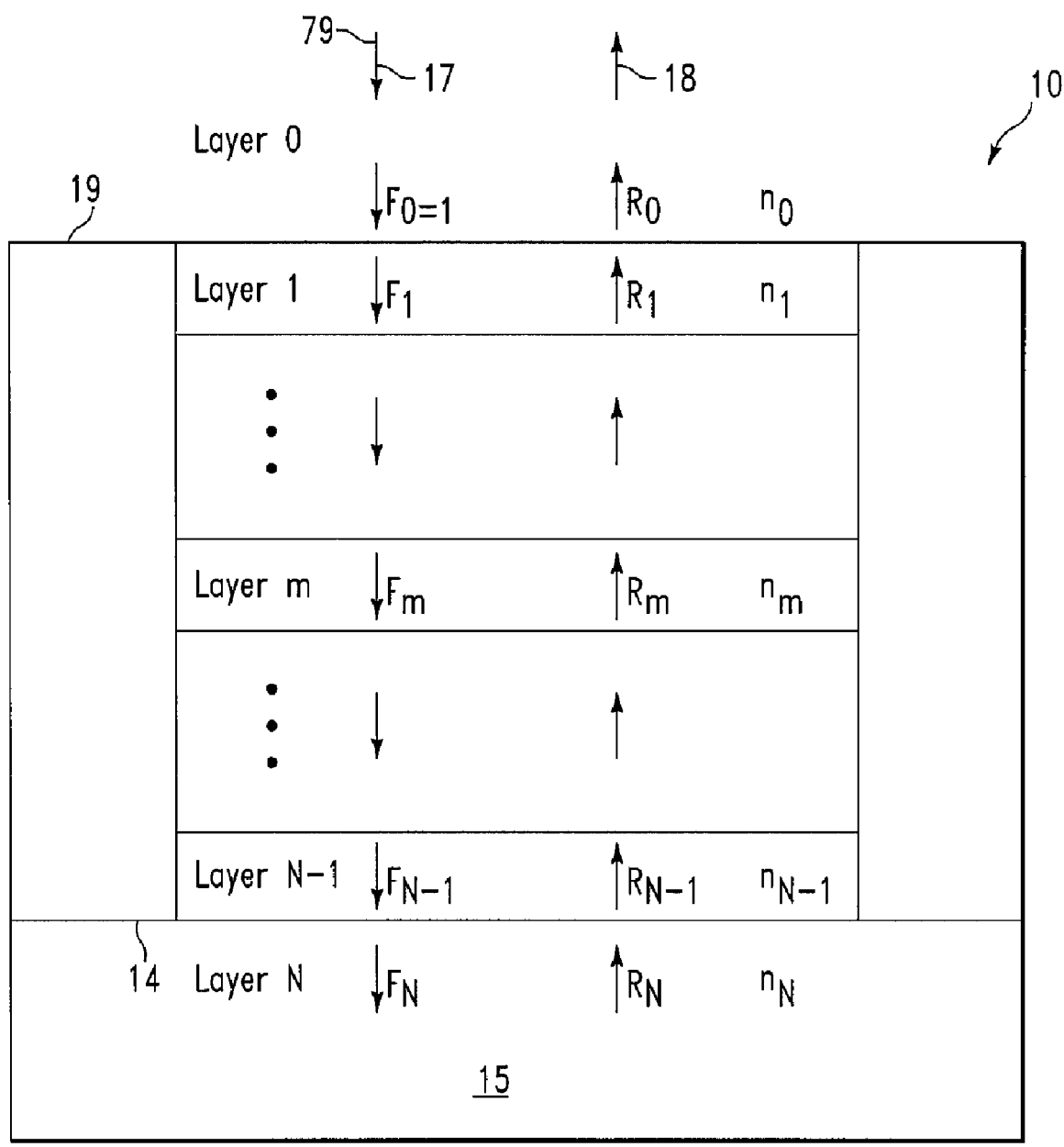
FIG. 8 depicts normally incident radiation propagating through the layers of a stack in a substrate, in accordance with embodiments of the present invention.

3.1 Normal Incidence of Radiation $T(\lambda,\Omega)$ may be computed for a given combination of $\lambda$ and $\Omega$ under the assumption that the radiation is normally incident upon the substrate. For normal incidence of the radiation at a specified wavelength $\lambda$, FIG. 8 depicts the incident radiation 79 propagating through the layers of a stack in the substrate 10, in accordance with embodiments of the present invention. In FIG. 8, the stack comprises N−1 layers denoted as layers 1, 2, ..., N−1. Layer 0 characterizes the medium from which the radiation 79 enters the stack at top surface 19. Layer N represents the base layer 15 into which the radiation is transmitted from layer N−1 of the stack at interfacial layer 14. In FIG. 8, $n_m$ denotes the index of refraction of layer m, $z_m$ denotes the coordinate value in the direction 17 at the interface between layer m and layer m+1 (m=0, 1, ..., N−1) subject to $z_0=0$. $F_m$ denotes the forward electric field complex amplitude in layer m for the radiation propagating in the direction 17. $R_m$ denotes the reflected electric field complex amplitude in layer m for the reflected radiation propagating in the direction 18 which is opposite the direction 17 (m=0, 1, ..., N). Physically, the reflected components $R_m$ are generated by the discontinuity in index of refraction at the interfaces (i.e., between layers m−1 and m for m=1, 2, ..., N).

Continuity of the electric field and its derivative at the interface between layers m−1 and m (m=1, 2, ..., N) respectively results in the following equations:

$$F_{m-1}\exp(ik_{m-1}z_{m-1}) + R_{m-1}\exp(-ik_{m-1}z_{m-1}) = \\ F_m\exp(ik_m z_m) + R_m\exp(-ik_m z_m) \tag{10}$$

$$k_{m-1}F_{m-1}\exp(ik_{m-1}z_{m-1}) - k_{m-1}R_{m-1}\exp(-ik_{m-1}z_{m-1}) = \\ k_m F_m\exp(ik_m z_m) - k_m R_m\exp(-ik_m z_m) \tag{11}$$

where $k_m = 1/(2\pi n_m \lambda)$. Note that "i" in $\exp(\pm k_m z_m)$ denote the square root of −1 and should not be confused with the use of "i" as a subscript in the description of the present invention herein.

Exemplary boundary conditions are $F_0=1$ and $R_N=0$. For the preceding exemplary boundary conditions, Equations (10)-(11) provide 2N linear equations and there are 2N unknowns ($F_1, \ldots, F_N, R_0, \ldots, R_{N-1}$) which may be solved by any method known to a person of ordinary skill in the art (e.g., matrix inversion).

The resultant transmission coefficient T is calculated as $T=(1-|R_0|^2)/|F_0|^2$; i.e. or $T=1-|R_0|^2$ for the assumed $F_0=1$ with the preceding exemplary boundary conditions. Note that the assumption of $F_0=1$ is arbitrary and any numerical value could have been chosen for $F_0$, since the transmission coefficient is the fraction of transmitted energy flux and therefore does not depend on the magnitude of $F_0$.

The preceding exemplary boundary condition of $R_N=0$ may occur if all of the radiation entering layer N through the stack shown in FIG. 8 is absorbed in layer N. Alternative embodiments may be characterized by $R_N \neq 0$, which can be treated in a similar manner as with the $R_N=0$ embodiment described supra, by setting the reflection coefficient to zero in a layer N'>N in which no reflections occur and adding additional equations, similar to Equations (10) and (11), for layers N+1, ..., N'. Layer N' represents the medium (e.g., air) just below and in direct mechanical contact with the substrate, as occurs in at least two additional embodiments. In the first additional embodiment, layer N is a terminating layer of the substrate (i.e., a bottom layer of the substrate), so that N'=N+1. In the second additional embodiment, the substrate comprises additional layers below layer N, so that N'>N+1.

3.2 Angular Incidence of Radiation

Figure 9:
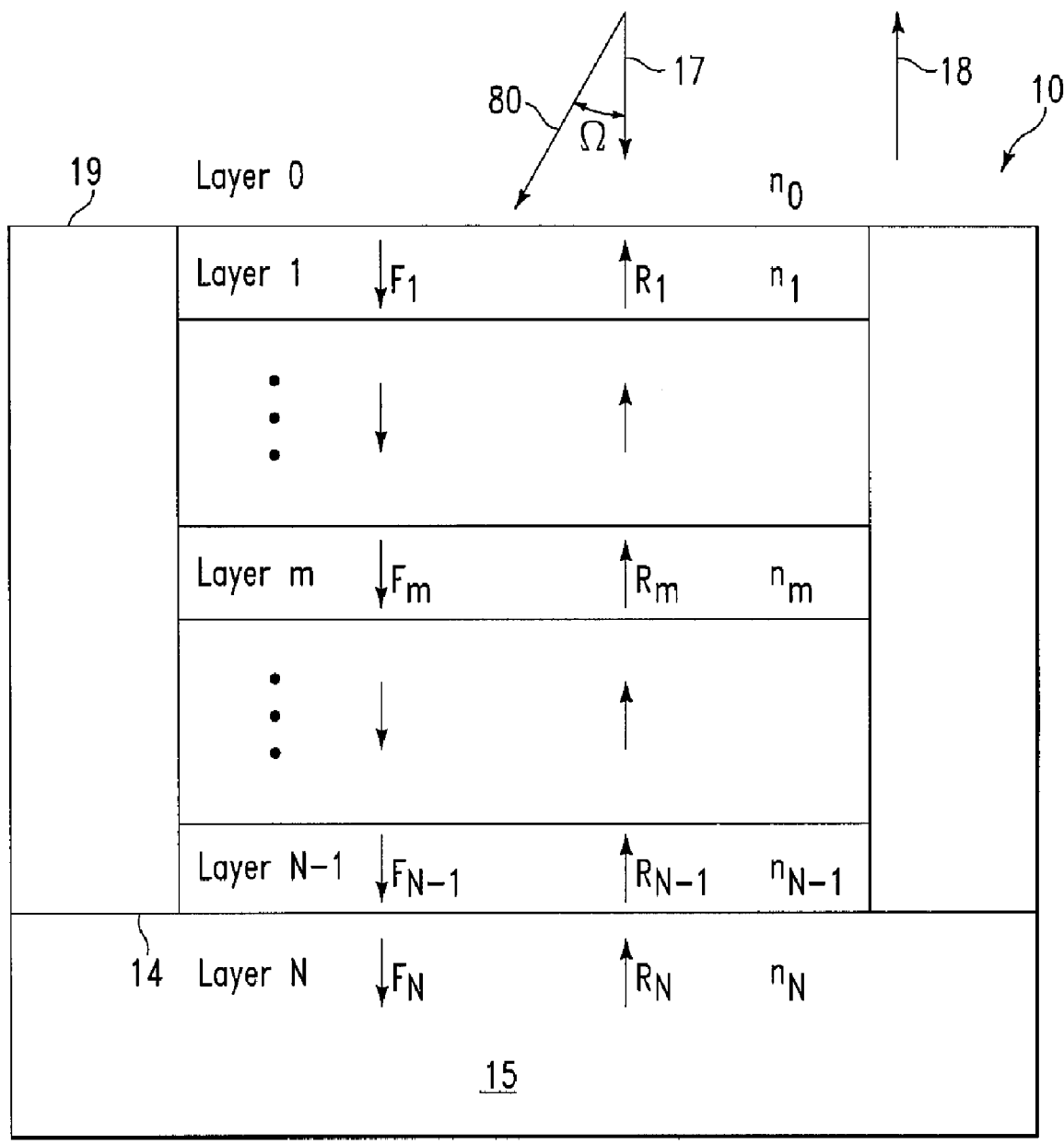
FIG. 9 depicts radiation incident on a stack of a substrate at a solid angle, in accordance with embodiments of the present invention.

FIG. 9 depicts radiation 80 as incident on a stack of the substrate 10 at a solid angle $\Omega$ with respect to a direction 17, in accordance with embodiments of the present invention. In FIG. 9, the stack comprises N-1 layers denoted as layers 1, 2, ..., N-1. Layer 0 characterizes the medium from which the radiation enters the stack at top surface 19, and layer N represents the base layer 15 into which the radiation is transmitted from layer N-1 of the stack at interfacial layer 14.

Figure 10:
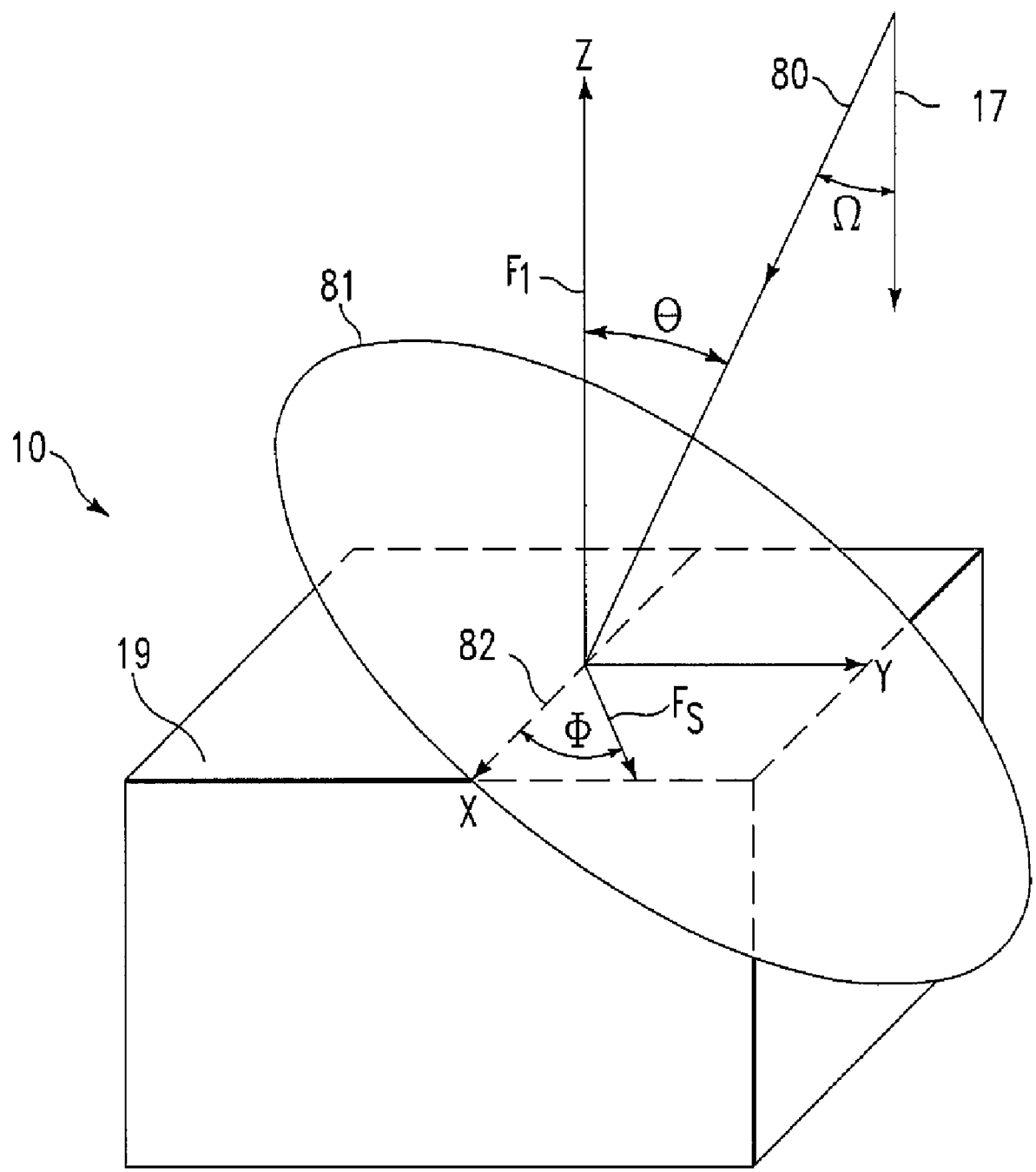
FIG. 10 depicts the substrate and radiation of FIG. 9 such that the solid angle defines a polar angle and an azimuthal angle with respect to a rectangular coordinate system, in accordance with embodiments of the present invention.

FIG. 10 depicts the substrate 10 and radiation 80 of FIG. 9 such that the solid angle $\Omega$ defines a polar angle $\theta$ and an azimuthal angle $\Phi$ with respect to a rectangular coordinate system having orthogonal axes X, Y, and Z, in accordance with embodiments of the present invention. The plane 81 is normal to the incident radiation 80. The electric and magnetic field vectors associated with the radiation 80 are in the plane 81. The plane 81 intersects the substrate 10 in the line 82 which is the X axis of the coordinate system. The Y axis is in the plane of the top surface 19 of the substrate 10 and is orthogonal to the X axis. The Z axis is orthogonal to the plane of the top surface 19 of the substrate 10. Thus the polar angle $\theta$ is the angle between the direction of the radiation 80 and the Z axis. The X axis is in both the plane of the substrate 10 and the plane 81. The Y axis is in the plane of the substrate 10 and at an angle $\theta$ with respect to the plane 81.

Let $\underline{F}$ be a vector representing the forward electric field (in the plane 81) associated with the incident radiation 80 into the substrate 10, wherein F denotes the magnitude of $\underline{F}$. Let $\underline{F}_Z$ be a vector representing the electric field projected onto the Z axis, wherein $F_Z$ denotes the magnitude of $\underline{F}_Z$. Let $\underline{F}_S$ be a vector representing the electric field projected onto the plane of the top surface 19 of the substrate 10. The azimuthal angle $\Phi$ is the angle between the X axis and $\underline{F}_S$ as shown. Let $F_X$ and $F_Y$ denote the magnitude of the projection of $\underline{F}_S$ onto the X axis and the Y axis, respectively. Based on the preceding definitions, $F_X$, $F_Y$, and $F_Z$ are related to F, $\theta$, and $\Phi$ via:

$$F_X = F \cos\theta \cos\phi \quad (12)$$

$$F_Y = F \cos\theta \sin\phi \quad (13)$$

$$F_Z = F \sin\theta \quad (14)$$

In FIGS. 9-10, the forward component and reverse component of the radiation 80 are associated with the directions 17 and 18, respectively. The index of refraction of layer m is $n_m$, and $z_m$ denotes the coordinate value along the Z axis in the direction 17 at the interface between layer m and layer m+1 (m=0, 1, ..., N-1), wherein $z_0=0$. $F_{X,m}$, $F_{Y,m}$, and $F_{Z,m}$ denote the electric field complex amplitude in the X, Y, and Z direction, respectively, in layer m (m=0, 1, ..., N) for the forward component of the radiation 80. $R_{X,m}$, $R_{Y,m}$, and $R_{Z,m}$ denote the electric field complex amplitude in the X, Y, and Z direction, respectively, in layer m (m=0, 1, ..., N) for the reverse component of the radiation 80. Physically, the reflected components $R_{X,m}$, $R_{Y,m}$, and $R_{Z,m}$ are generated by the discontinuity in index of refraction at the interfaces (i.e., between layers m-1 and m for m=1, 2, ..., N). Note that in the description infra, the upper case symbols X, Y, Z denote coordinates axes, whereas the lower case symbols x, y, z denote the coordinate values respectively corresponding to the coordinates axes X, Y, Z.

Continuity of the X component of electric field and its derivative at the interface between layers m-1 and m (m=1, 2, ..., N) respectively results in the following equations:

$$F_{X,m-1}\exp(ik_{m-1}z_{m-1}) + R_{X,m-1}\exp(-ik_{m-1}z_{m-1}) = \quad (15)$$
$$F_{X,m}\exp(ik_m z_m) + R_{X,m}\exp(-ik_m z_m)$$

$$k_{m-1}F_{X,m-1}\exp(ik_{m-1}z_{m-1}) - k_{m-1}R_{X,m-1}\exp(-ik_{m-1}z_{m-1}) = \quad (16)$$
$$k_m F_{X,m}\exp(ik_m z_m) - k_m R_{X,m}\exp(-ik_m z_m)$$

wherein
$$k_m = 1/(2\pi n_m \lambda).$$

Continuity of the Y component of electric field and its derivative at the interface between layers m-1 and m (m=1, 2, ..., N) respectively results in the following equations:

$$F_{Y,m-1}\exp(ik_{m-1}z_{m-1}) + R_{Y,m-1}\exp(-ik_{m-1}z_{m-1}) = \quad (17)$$
$$F_{Y,m}\exp(ik_m z_m) + R_{Y,m}\exp(-ik_m z_m)$$

$$k_{m-1}F_{Y,m-1}\exp(ik_{m-1}z_{m-1}) - k_{m-1}R_{Y,m-1}\exp(-ik_{m-1}z_{m-1}) = \quad (18)$$
$$k_m F_{Y,m}\exp(ik_m z_m) - k_m R_{Y,m}\exp(-ik_m z_m)$$

Let $D_{Z,m}$ denote the displacement complex amplitude in the Z direction in layer m and let $\epsilon_m$ denote the permittivity of layer m (m=0, 1, ..., N). $D_{Z,m} = n^2_m F_{X,m}$, since $D_{Z,m} = \epsilon_m F_{Z,m}$ and $n_m = (\epsilon_m)^{1/2}$ (m=0, 1, 2, ..., N). Therefore, continuity of the Z component of the displacement and its derivative in the direction Z (i.e., direction 17) at the interface between layers m-1 and m (m=1, 2, ..., N) respectively results in the following equations;

$$n^2_{m-1}(F_{Z,m-1}\exp(ik_{m-1}z_{m-1}) + R_{Z,m-1}\exp(-ik_{m-1}z_{m-1})) = \quad (19)$$
$$n^2_m(F_{Z,m}\exp(ik_m z_m) + R_{Z,m}\exp(-ik_m z_m))$$

$$n^2_{m-1}(k_{m-1}F_{Z,m-1}\exp(ik_{m-1}z_{m-1}) - k_{m-1}R_{Z,m-1}\exp(-ik_{m-1}z_{m-1})) = \quad (20)$$
$$n^2_m(k_m F_{Z,m}\exp(ik_m z_m) - k_m R_{Z,m}\exp(-ik_m z_m))$$

Equations (12)-(14) provide boundary conditions of $F_{X,0}=F_0 \cos\theta \cos\Phi$, $F_{Y,0}=F_0 \cos\theta \sin\Phi$, and $F_{Z,0}=F_0 \sin\theta$, for a given electric field magnitude $F_0$ in layer 0. Additional boundary conditions which may be employed are $R_{X,N}=R_{Y,N}=R_{Z,N}=0$. For the preceding boundary conditions, Equations (15)-(20) provide 6N linear equations and there are 6N unknowns ($F_{X,1}$, $F_{Y,1}$, $F_{Z,1}$, ..., $F_{X,N}$, $F_{Y,N}$, $F_{Z,N}$, $R_{X,0}$, $R_{Y,0}$, $R_{Z,0}$ ..., $R_{X,N-1}$, $R_{Y,N-1}$, $R_{Z,N-1}$) which may be solved by any method (e.g., matrix inversion) known to a person of ordinary skill in the art.

The resultant transmission coefficient T is calculated as $T=(1-|R_{X,0}|^2-|R_{Y,0}|^2-|R_{Z,0}|^2)/(|F_{X,0}|^2+(|F_{Y,0}|^2+(|F_{Z,0}|^2)$. However, $|F_{X,0}|^2+(|F_{Y,0}|^2+(|F_{Z,0}|^2=|F_0|^2$ from the preceding boundary conditions of $F_{X0}=F \cos \theta \cos \Phi$, $F_{Y0}=F \cos \theta \sin \Phi$, and $F_{Z0}=F \sin \theta$. Therefore $T=(1-|R_{X,0}|^2-|R_{Y,0}|^2-|R_{Z,0}|^2)/|F_0|^2$. Note that the value $F_0$ (e.g., $F_0=1$) is arbitrary and any numerical value could have been chosen for $F_0$, since the transmission coefficient is the fraction of transmitted energy flux and therefore does not depend on the magnitude of $F_0$.

The preceding exemplary boundary condition of $R_{X,N}=R_{Y,N}=R_{Z,N}=0$ may occur if all of the radiation entering layer N through the stack shown in FIG. 9 is absorbed in layer N. Alternative embodiments may be characterized by a non-zero value in at least one of $R_{X,N}$, $R_{Y,N}$, and $R_{Z,N}$. These alternative embodiments can be treated in a similar manner as with the $R_{X,N}=R_{Y,N}=R_{Z,N}=0$ embodiment described supra, by setting the reflection coefficients $R_{X,N'}$, $R_{Y,N'}$, and $R_{Z,N'}$, to zero in a layer N'>N in which no reflections occur and adding additional equations, similar to Equations (15)-(20), for layers N+1, ..., N'. ... Layer N' represents the medium (e.g., air) just below and in direct mechanical contact with the substrate, as occurs in at least two additional embodiments. In the first additional embodiment, layer N is a terminating layer of the substrate (i.e., a bottom layer of the substrate), so that N'=N+1. In the second additional embodiment, the substrate comprises additional layers below layer N, so that N'>N+1.

4. Computer System

Figure 11:
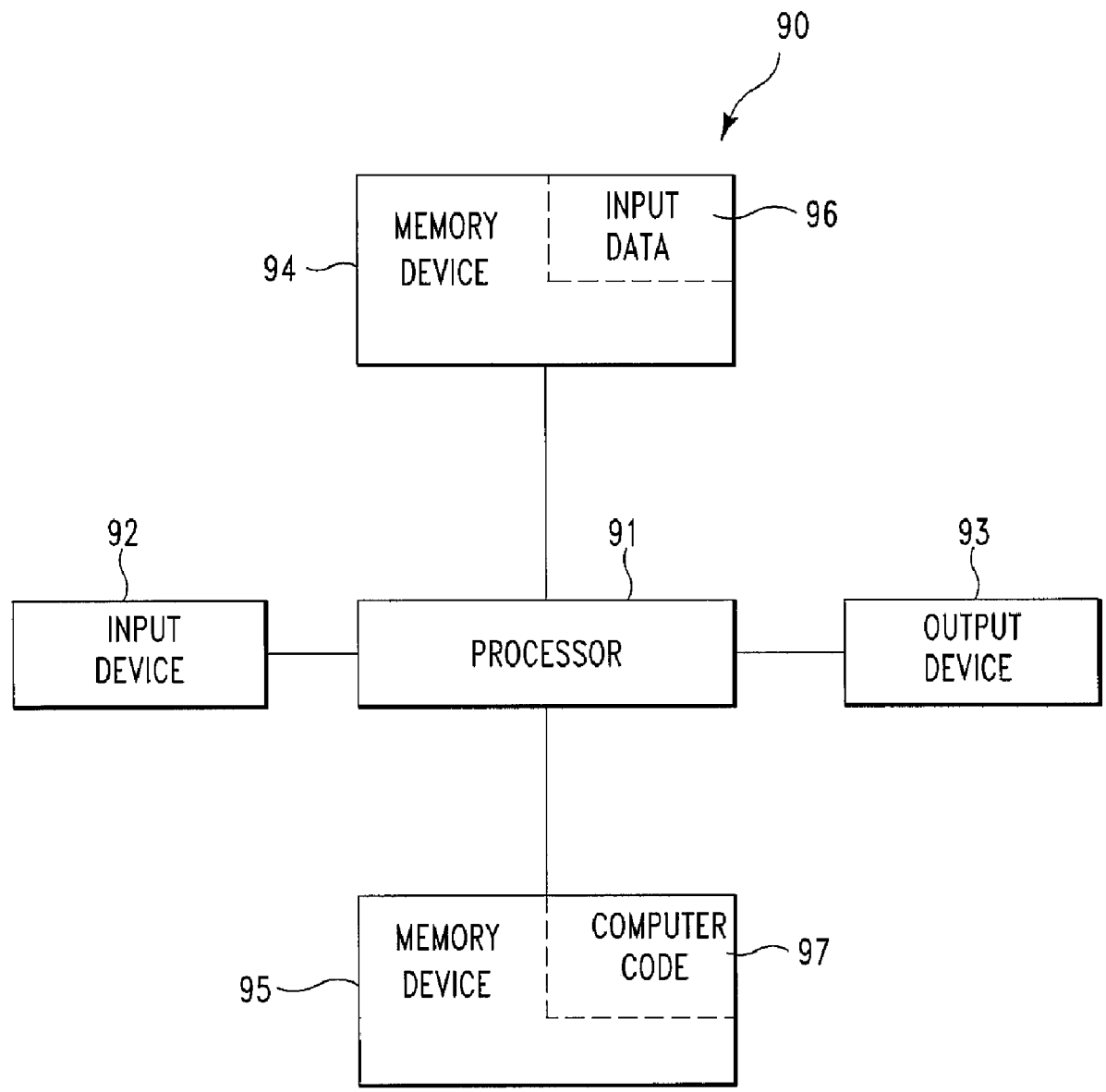
FIG. 11 illustrates a computer system used for configuring radiation sources to simultaneously irradiate a substrate, in accordance with embodiments of the present invention.

FIG. 11 illustrates a computer system 90 used for configuring radiation sources to simultaneously irradiate a substrate, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97 which is a computer program that comprises computer-executable instructions. The computer code 97 includes an algorithm for configuring radiation sources to simultaneously irradiate a substrate with multiple radiation sources as described supra. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 11) may be used as a computer usable medium (or a computer readable medium or a program storage device) having a computer readable program embodied therein and/or having other data stored therein, wherein the computer readable program comprises the computer code 97. Generally, a computer program product (or, alternatively, an article of manufacture) of the computer system 90 may comprise said computer usable medium (or said program storage device).

While FIG. 11 shows the computer system 90 as a particular configuration of hardware and software, any configuration of hardware and software, as would be known to a person of ordinary skill in the art, may be utilized for the purposes stated supra in conjunction with the particular computer system 90 of FIG. 12. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for configuring radiation sources to simultaneously irradiate a substrate, said method comprising:
    specifying J electromagnetic sources of radiation, wherein a power distribution of emitted radiation for each source of the J sources is a different function of wavelength and angular distribution of the emitted radiation, said J≧2;
    specifying the substrate, said substrate comprising a base layer and I stacks on the base layer, said I≧2, wherein $P_j$ denotes a same normally incident energy flux on each stack from source j such that $P_j$ is specific to source j for j=1, 2, ..., J;
    specifying a target energy flux $S_i$ targeted to be transmitted via each stack i into the substrate such that $S_i$ is specific to each stack i; and
    for simultaneous exposure of the I stacks to electromagnetic radiation from the J sources, a processor of a computer system calculating each $P_j$ such that an error E being a function of $|W_1-S_1|$, $|W_2-S_2|$, ..., $|W_I-S_I|$ is about minimized with respect to $P_j$ for j=1, 2, ..., J, wherein $W_i$ denotes an actual energy flux transmitted into the substrate via stack i for i=1, 2, ..., and I.

2. The method of claim 1, wherein $E=\Sigma_i(W_i-S_i)^2$, wherein $\Sigma_i$ denotes a summation over i from i=1 to i=I.

3. The method of claim 1, wherein the method further comprises specifying transmission coefficients $T_{ij}$, wherein $T_{ij}$ is the fraction of the energy flux $P_j$ that is transmitted via stack i into the substrate, and wherein $W_i=\Sigma_j T_{ij}P_j$ such that $\Sigma_j$ denotes a summation over j from j=1 to j=J.

4. The method of claim 1, wherein the method further comprises analyzing said error, said analyzing comprising:
    ascertaining whether E exceeds a specified maximum error $E_{MAX}$;
    if said ascertaining ascertains that E does not exceeds $E_{MAX}$ then ending said method;
    if said ascertaining ascertains that E exceeds $E_{MAX}$ then modifying the substrate or modifying the sources, followed by iteratively performing said computing and said analyzing until E does not exceeds $E_{MAX}$ or until a maximum specified number of iterations of said computing and said analyzing has been performed, wherein said modifying the substrate comprises adding a dielectric layer to a top surface of the substrate such that the added dielectric layer is directly exposed to the radiation, and wherein said modifying the sources comprises replacing said J sources with J' sources such that J'≧2 and said J' sources collectively differ from said J sources.

5. The method of claim 4, wherein said ascertaining ascertains that E does not exceeds $E_{MAX}$ during a unique iteration of said computing and said analyzing, wherein said modifying the sources is performed during the unique iteration, and wherein said replacing the J sources with J' sources during the unique iteration is subject to J'>J.

6. The method of claim 4, wherein said ascertaining ascertains that E does not exceeds $E_{MAX}$ during a unique iteration of said computing and said analyzing, wherein said modifying the sources is performed during the unique iteration, and wherein said replacing the J sources with J' sources during the unique iteration is subject to J'=J such that the power distribution with respect to wavelength of at least one source of the J sources is changed during the unique iteration.

7. The method of claim 4, wherein said ascertaining ascertains that E does not exceeds $E_{MAX}$ during a unique iteration of said computing and said analyzing, wherein said modifying the sources is performed during the unique iteration, and wherein said replacing the J sources with J' sources during the unique iteration is subject to J'=J such that the angular distribution of radiated power of the power distribution of at least one source of the J sources is changed during the unique iteration.

8. The method of claim 1, wherein the method further comprises computing a source power of the power distribution of each source of the J sources from the computed energy fluxes $P_j$ (j=1, 2, ..., J).

9. The method of claim 8, wherein the method further comprises adjusting the computed source power of the power distribution of the J sources to satisfy a specified design condition on the substrate.

10. A method for simultaneously irradiating a substrate by a plurality of radiation sources, said method comprising:

providing J electromagnetic sources of radiation, wherein a power distribution of emitted radiation for each source of the J sources a different function of wavelength and angular distribution of the emitted radiation, said J≧2;

providing the substrate, said substrate comprising a base layer and I stacks on the base layer, said I≧2, wherein $P_j$ denotes a same normally incident energy flux on each stack from source j such that $P_j$ is specific to source j for j=1, 2, ..., J; and concurrently exposing the I stacks to electromagnetic radiation from the J sources in one exposure step such that at least one of a first condition and a second condition is satisfied;

wherein the first condition is that an error E being a function of $|W_1-S_1|, |W_2-S_2|, \ldots, |W_I-S_I|$ is about minimized with respect to $P_j$ for j=1, 2, ... J, wherein $S_i$ denotes a specified target energy flux targeted to be transmitted via each stack i into the substrate such that $S_i$ is specific to each stack i for i=1, 2, ..., I, wherein $W_i$ denotes an actual energy flux transmitted into the substrate via stack i for i=1, 2, ..., and I;

wherein the second condition is a specified design condition on the substrate pertaining to a device parameter of the substrate.

11. The method of claim 10, wherein $E=\Sigma_i(W_i-S_i)^2$, wherein $\Sigma_i$; denotes a summation over i from i=1 to i=I.

12. The method of claim 10, wherein $W_i=\Sigma_j T_{ij}P_j$ such that $\Sigma_j$ denotes a summation from j=1 to j=J, and wherein Tij is the fraction of the energy flux $P_j$ that is transmitted via stack i into the substrate, for i=1, 2, ..., and I.

13. The method of claim 10, wherein the first condition is satisfied.

14. The method of claim 10, wherein the second condition is satisfied.

15. The method of claim 10, wherein J=I.

16. The method of claim 10, wherein J≠I.

17. The method of claim 10, wherein a first source of the J sources is monochromatic.

18. The method of claim 10, wherein a first source of the J sources is polychromatic.

19. The method of claim 10, wherein the electromagnetic radiation from a first source of the J sources is unidirectional and is normally incident upon the I stacks.

20. The method of claim 10, wherein the electromagnetic radiation from a first source of the J sources is non-normally incident upon the I stacks.

* * * * *